United States Patent [19]

Miwada

[11] Patent Number: 4,974,239
[45] Date of Patent: Nov. 27, 1990

[54] OUTPUT CIRCUIT OF A CHARGE TRANSFER DEVICE

[75] Inventor: Kazuo Miwada, Tokyo, Japan

[73] Assignee: NEC Corporation, Japan

[21] Appl. No.: 296,574

[22] Filed: Jan. 12, 1989

[30] Foreign Application Priority Data

Jan. 12, 1988 [JP] Japan .................................. 63-5231

[51] Int. Cl.⁵ ........................ G11C 27/02; G11C 27/04
[52] U.S. Cl. ......................................... 377/60; 377/58; 377/63
[58] Field of Search ............................. 377/60, 63, 58

[56] References Cited

U.S. PATENT DOCUMENTS

| | | | |
|---|---|---|---|
| 4,099,075 | 7/1978 | Goldberg et al. | 377/60 |
| 4,156,818 | 5/1979 | Collins et al. | 377/60 |
| 4,528,684 | 7/1985 | Iida et al. | 377/60 |
| 4,556,851 | 12/1985 | Levine | 377/60 |
| 4,803,709 | 2/1989 | Kimath | 377/60 |

OTHER PUBLICATIONS

IEEE Journal of Solid-State Circuits, vol. SC-9, (Feb., 1974), pp. 1-12, "Characterization of Surface Channel CCD Image Arrays at Low Light Levels", by White et al.

Primary Examiner—John S. Heyman
Attorney, Agent, or Firm—Laff, Whitesel, Conte & Saret

[57] ABSTRACT

There is disclosed an output circuit of a charge transfer device including an output section of the charge transfer device which has a floating diffusion region receiving charges transferred through the charge transfer section to detect the quantity of the charges, an output holding section which holds the DC level of the voltage outputted from the output section, a comparing section which compares the DC level held by the output holding section with a reference voltage Vref, and means for applying the output of the comparing section to the floating diffusion region to reset charges in the floating diffusion region.

7 Claims, 2 Drawing Sheets

OUTPUT CIRCUIT OF A CHARGE TRANSFER DEVICE

BACKGROUND OF THE INVENTION

1. Field of the Invention

The present invention relates to an output circuit of a charge transfer device and, more particularly, to an improvement thereof for controlling the DC level of an output signal.

2. Description of the Related Arts

The charge transfer device, such as a charge-coupled device (CCD) transfers charges through a semiconductor substrate and along a channel on which a plurality of electrodes are aligned in a line through a thin insulator film. Charges transferred along the channel are detected in a form of voltage by introducing them into a floating diffusion region formed in contact with the channel. The floating diffusion region is formed in the semiconductor substrate as a diode region to operate as a capacitor element. The capacitor element produces a voltage in accordance with the quantity of the introduced charges. The produced voltage is amplified by a MOS source-follower circuit to form it into an electrical signal. The electrical signal is supplied to a clamping circuit to remove an effect thereon from the pulses for operating the CCD, and then used in various circuits using the output from the CCD. This output circuit has been demonstrated by M. H. White et al in a publication of "IEEE JOURNAL OF SOLID-STATE CIRCUITS" Vol. SC-9 (February, 1974), pp 1-12 and is shown in FIG. 1 of the attached drawings, in a simplified fashion.

The output circuit shown in FIG. 1 includes an output-detection circuit 20 and a clamp circuit 30. The output-detection circuit 20 is formed on a silicon substrate together with a charge transfer region 10 in which a channel is formed for transferring charges. Charges transferred through the channel are injected into a diode 27 which is formed as a floating diffusion region in the charge transfer region 10 in contact with the channel. A change in potential at an electrode P of the diode 27 is detected and amplified by a source follower circuit formed of transistors 22 and 23. Thereafter, the detected and amplified potential change is applied to the clamp circuit 30 having a capacitor 36, a transistor 35 and a buffer amplifier 4, thus obtaining an output, the DC level of which is clamped at $V_{CL}$ by the clamp circuit 30. It should be noted that a transistor 21 is a depletion type MOS transistor which functions as a reset transistor for the diode 27. The reference symbols RD and $\phi_R$ denote a reset drain terminal held at a constant potential and a reset pulse for operating the reset transistor 27, respectively. Further, AG denotes a bias voltage for controlling a DC current flowing through the source follower circuit.

The DC level of the output voltage $V_{OUT}$ from the output-detection circuit 20 is expressed as follows. If the threshold voltage of the transistor 22 is represented by $V_{T2}$, the threshold voltage of the transistor 23 by $V_{T3}$, the voltage at the terminal OD by $V_{OD}$, the voltage at the terminal RD by $V_{RD}$, the voltage at the terminal AG by $V_{AG}$, the voltage gain $\beta$ of the transistor 22 by $\beta_2$, and the voltage gain $\beta$ of the transistor 23 by $\beta_3$, the following relationship holds upon condition that the transistors 22 and 23 in the source follower circuit operate in the saturation region:

$$I_{OD} = \beta_2(V_{RD} - V_{OUT} - V_{T2})^2 = \beta_3(V_{AG} - V_{T3})^2 \quad (1)$$

and from the above expression, the following formula (2) is obtained:

$$V_{OUT} = V_{RD} - V_{T2} - \sqrt{\frac{\beta_3}{\beta_2}}(V_{AG} - V_{T3}) \quad (2)$$

In the above-described output-detection circuit 20, however, the threshold voltages $V_{T2}$ and $V_{T3}$ of the MOS transistors 22 and 23 vary due to variations in the manufacturing process. Therefore, it has heretofore been impossible to adjust the level of the output DC potential $V_{OUT}$ as will be understood from the formula (2). Accordingly, it has heretofore been difficult to connect directly the charge transfer device with a peripheral circuit using the output $V_{OUT}$. Therefore, it is necessary to interpose the clamp circuit 30 or the like as shown in FIG. 3 in order to control the DC level and to remove the effect from the pulses for operating the charge transfer region 10.

It is, therefore, a primary object of the present invention to provide an output circuit of a charge transfer device producing an output having a controlled amplitude irrespective of manufacturing errors.

It is another object of the present invention to provide an output circuit which is connectable to a circuit using the CCD output without interposing a clamp circuit.

SUMMARY OF THE INVENTION

In accordance with the present invention, there is provided an output circuit of a charge transfer device comprising: an output-detection circuit for receiving charges to inject them into a floating diffusion region for converting the quantity of the charges into a voltage form of output signal; the floating diffusion region being reset periodically to a constant voltage, an output holding section for holding a D.C. level of the voltage output signal; a comparing section comparing the D.C. level held by the output holding section with a reference D.C. voltage; and a means for controlling the constant voltage so as to control the D.C. level of the voltage output signal to the reference D.C. voltage.

The control of the D.C. level of the voltage output signal may be achieved by constituting the output holding section with the same constitution as the output-detection circuit and by controlling the constant voltages applied to the output-detection circuit and the output holding circuit by the comparison result of the comparing section. The control of the D.C. level of the voltage output signal may be alternatively achieved by constituting the output holding section with a sample hold circuit for holding the voltage form output signal at a time when the floating diffusion region is reset to the constant voltage, and by controlling the constant voltage by the comparison result of the comparing section.

According to the present invention, the constant voltage to which the floating diffusion region is reset is controlled by the output holding section, the comparing section and the controlling means, so as to keep the D.C. level of the voltage output signal at the reference D.C. voltage. It is possible to give a constant and controlled D.C. level to the voltage output signal even if the threshold voltages of the transistors may vary. Due to this constant and controlled D.C. level, the voltage output signal can be directly applied to a circuit using the CCD output without interposing any clamp circuit. There is another merit based on the constant and controlled D.C. level that the derived voltage output signal does not have a noise component which fluctuates the D.C. level of the voltage form output signal by the effect of the pulses for operating the charge transfer device.

BRIEF DESCRIPTION OF THE DRAWINGS

The above and further object, features and advantages of the present invention will become more apparent from the following detailed description taken in conjunction with the accompanying drawings, wherein.

DETAILED DESCRIPTION OF THE EMBODIMENTS

Figure 1:
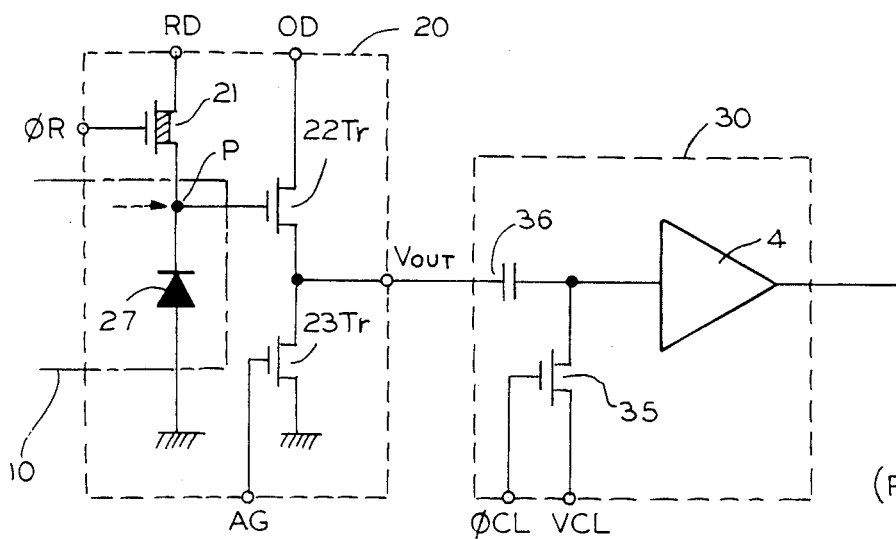
FIG. 1 is a circuit diagram of an output circuit of a charge coupled device in the prior art.
Figure 2:
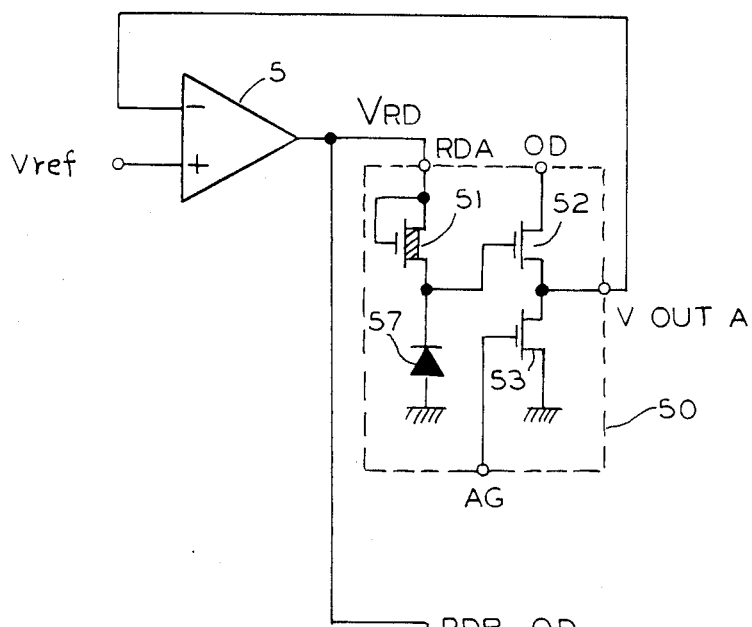
FIG. 2 is a circuit diagram of an output circuit of a charge coupled device according to a first preferred embodiment of the present invention.
Figure 2:
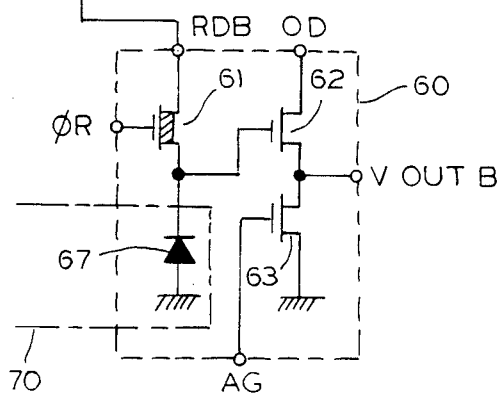

FIG. 2 is a circuit diagram showing a first embodiment of the present invention. A charge transfer device is formed on a silicon substrate with a charge transfer region 70 and an output detection circuit 60. The charge transfer region 70 has a channel region on which a plurality of transfer electrodes are formed in series via a thin-insulator film to form a charge coupled device. At an end of the channel region, a diode 67 is formed as a floating diffused region of a conductivity type which is opposite to the conductivity type of the silicon substrate to receive charges transferred through the channel region.

The floating diffused region is connected to receive a reset voltage $R_{DB}$ through a reset transistor 61. The ON and OFF of the reset transistor 61 is controlled by a reset pulse $\phi_R$ applied to a gate electrode of the reset transistor 61. By turning ON the reset transistor 61, charges in the stray capacitance of the diode 67 is reset to the reset voltage $V_{RD}$ at the terminal $R_{DB}$. After turning OFF the reset transistor 61, charges transferred through the channel are injected into the stray capacitance of the diode 67. As a result, the voltage at the floating diffusion region changes in accordance with the quantity of injected charges. The obtained voltage is applied to a source-follower transistor 62 to be amplified. A bias-current control transistor 63 is connected to the source electrode of the source-follower transistor 62, as a load. The bias current flowing through the source-follower transistor 62 is controlled by a bias-control voltage $V_{AG}$ at a terminal AG. An output signal $V_{out\ B}$ is derived from the source electrode of the source-follower transistor 62.

In this embodiment, a dummy output circuit 50 is employed to hold the same DC level as the output signal $V_{out\ B}$. The DC level held by the dummy output circuit 50 is derived as the output $V_{out\ A}$. In the dummy output circuit 50, a diode 57 and transistors 51 to 53, have the same dimensions and impurity concentrations as the diode 67. The transistors 61 to 63 are connected in the same circuit as the output-detection circuit 60, except for the connection of the gate electrode of the transistor 51, to produce the same DC voltage as the output signal $V_{out\ B}$ as the output $V_{out\ A}$. The same reset voltage $V_{RD}$, the same bias-control voltage $V_{AG}$, and the same power voltage $V_{DD}$ are similarly applied to the terminals RDA, AG and OD in the dummy output circuit 50.

The output $V_{out\ A}$ of the dummy output circuit 50 is compared with a reference voltage $V_{ref}$ by a comparator 5. The comparison result is commonly applied to the terminals RDA and RDB as the reset voltage $V_{RD}$. The dummy output circuit 50 and the comparator 5 form a feedback loop to control the level of the output $V_{out\ A}$ to have a value of the reference voltage $V_{ref}$. In other words, by the application of the comparison result of the comparator 5, that is, the reset voltage $V_{RD}$ to the terminal RDB, the DC level of the output $V_{out\ B}$ from the output-detection circuit 60 is controlled to have the value of the reference voltage $V_{ref}$.

The operation of the first preferred embodiment will be described below in more detail. The output $V_{out\ A}$ of the dummy output circuit 50 is compared with a reference voltage Vref by a comparator 5. Assuming that $V_{out\ A} > V_{ref}$, the output voltage of the comparator 5 reduce to lower the reset voltage $V_{RD}$. When the reset voltage $V_{RD}$ lowers, since the transistor 51 is constantly ON, the gate potential of the source-follower transistor 52 also lowers, resulting in a lowering in the output $V_{out\ A}$. The lowering of the output $V_{out\ A}$ stops when the output $V_{out\ A}$ becomes equal to the reference voltage Vref. In this way, the DC voltage level of the output $V_{out\ A}$ is constantly controlled so as to be the same as the reference voltage Vref. Thus, even if the threshold voltage of the transistors 52 and 53 varies, a difference between the threshold voltage and the reference voltage Vref is detected by means of the comparator 5 and the detected difference is applied to the drain of the reset transistor 61 in the output circuit 60 as the reset voltage $V_{RD}$, thereby enabling the DC level of the output $V_{out\ B}$ of the output circuit 60 to equal the reference voltage Vref.

The dummy output circuit 50 is constructed of the diode 57 and the transistors 51 to 53 having the same dimensions and the same impurity concentrations as those of the diode 67 and the transistors 61 to 63 of the output detection circuit 60 to have the same stray capacitance and the same voltage gains, respectively. The dummy output circuit 50 is thus formed of the same constituent elements as those of the output-detection circuit 60. Thus, both of the circuits 50, 60 have the same input-output characteristics. Therefore, it is possible to effect a control such that $V_{ref} = V_{out\ A} = V_{out\ B}$ by connecting the output of the comparator 5 to the terminal RDA which is connected to the drain of the transistor 51 in the dummy output circuit 50. This connection is made in the same way as terminal RDB is connected to the drain of the reset transistor 61 in the output-detection circuit 60, as shown in FIG. 2.

It should be noted that the diode 67 in the output-detection circuit 60 is constituted by a floating diffusion region formed at an end of a channel portion in the charge transfer region 70. The potential at the node between the diode 67 and the reset transistor 61 is outputted through the source follower circuit formed of the transistors 62 and 63 to be directly applied to a peripheral circuit using the output of the charge transfer region 70 or a CCD device.

Figure 3:
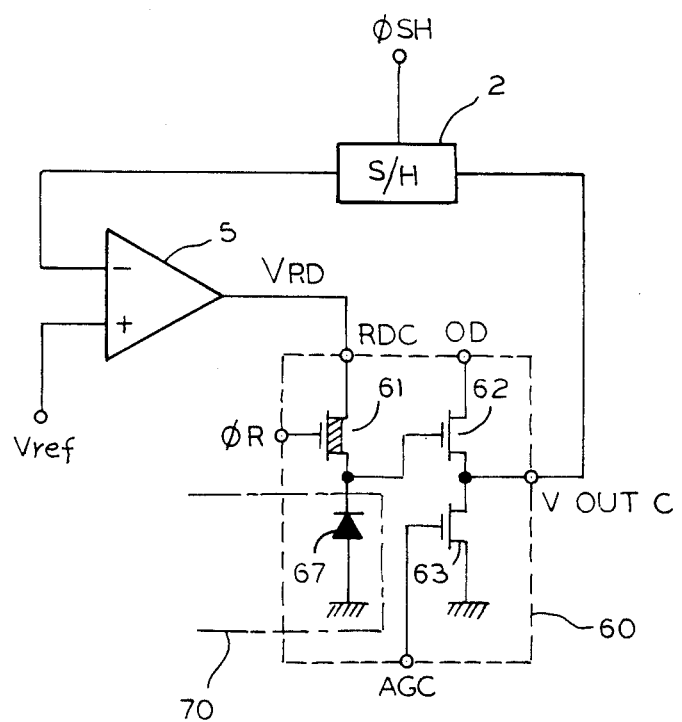
FIG. 3 is a circuit diagram of an output circuit of a charge coupled device according to a second preferred embodiment of the present invention.

FIG. 3 is a circuit diagram showing a second preferred embodiment of the present invention. This embodiment differs from the first preferred embodiment shown in FIG. 2 in that a sample-hold circuit (S/H) 2 is employed in place of the dummy output circuit 50 for holding the DC level of the output-detection circuit 60. The sampled voltage and the reference voltage $V_{ref}$ are compared with each other by the comparator 5 in order to control the reset voltage $V_{RD}$ at the terminal RDC. The basic feedback operation of this embodiment is the same as that of the first embodiment shown in FIG. 2. Thus, the DC level of the output $V_{out\,C}$ from the output-detection circuit 60 is held at the reference voltage $V_{ref}$.

In the circuit operation of this second embodiment, however, the S/H pulse $\phi_{SH}$ is synchronized with the reset pulse $\phi_R$ so that, at least during the period when the reset pulse $\phi_R$ is ON, the DC level of the output $V_{out\,C}$ is sampled to be held. During the period when a signal involving the charge information is being outputted (i.e., during the period when the reset pulse $\phi_R$ is OFF), the DC level of the output $V_{out\,C}$ is not sampled. In short, the arrangement is such that the sample-and-hold operation is conducted only during the period when the DC level of the output $V_{out\,C}$ is being outputted.

By conducting the sample-and-hold operation in this way, the sampled DC level is compared with the reference voltage $V_{ref}$ to apply the comparison result to the terminal RDC (drain electrode of the reset transistor 61) as the reset voltage $V_{RD}$. Due to the feedback operation in a loop of the output-detection circuit 60, the sample-hold circuit 2 and the comparator 5, the DC level of the output $V_{out\,C}$ is controlled to keep the same level as the reference voltage Vref, which is similar to the first preferred embodiment shown in FIG. 2.

As the sample-hold circuit 2, any kind of the well-known sample-hold circuits may be used. One example is shown in the above-mentioned publication "IEEE JOURNAL OF SOLID-STATE CIRCUITS" Vol. SC-9 (February 1974) page 4, at the right-hand side of FIG. 5 in which the switch ② should be formed of a MOSFET.

As has been described above, the output circuit of a charge transfer device according to the present invention incorporates a feedback circuit which applies a reset voltage having a controlled potential to a floating diffusion region through a reset transistor for resetting the charges in the floating diffusion region and is, therefore, capable of controlling the DC level of the output signal which varies in accordance with manufacturing error of circuit elements in the output circuit, so that it is advantageously possible to connect the output circuit directly to a peripheral circuit using the output signal.

It is a matter of course that it is possible not only to remove the above-described variations in the offset of the output DC voltage but also to control the output DC voltage itself by controlling the drain terminal voltage of the reset transistor and hence possible to effect adjustment for direct connection to the peripheral circuit.

The above-described feedback circuit may be applied not only to a floating diffusion type sense amplifier but also to a floating gate type sense amplifier.

What is claimed is:

1. An output circuit of a charge transfer device comprising: an output section which includes a floating diffusion region for detecting a quantity of charges transferred through a charge transfer section of said charge transfer device as a voltage form output signal and resetting means for resetting said floating diffusion region to a resetting voltage; an output holding section which holds DC level having a value which is the same as the DC level of said output signal; a comparing section which compares said DC level held by said output holding section with a reference voltage; and means for applying the output of said comparing section to said resetting means as said resetting voltage in order to reset said floating diffusion section to said resetting voltage.

2. The output circuit as claimed in claim 1, wherein said output holding section is a circuit section constituted of the same circuit elements as those of said output section connected in the substantially same circuit as said output section, said circuit elements in said circuit section having the substantially same electrical characteristics as those of said output section.

3. The output circuit as claimed in claim 2, wherein said output section and said circuit section are constituted of a diode, a reset transistor connected with said diode to periodically reset charges in said diode to a voltage of said output from said comparing section and a source follower circuit receiving the signal at the point connecting said diode and said reset transistor to produce said output signal, said diode in said output section being formed of said floating diffusion region receiving said charges transferred through said charge transfer section.

4. The output circuit as claimed in claim 1, wherein said output holding section is a sample-hold circuit holding the DC level of said output voltage by sampling the same.

5. The output circuit as claimed in claim 4, wherein said output section comprises a diode used as said floating diffusion region, a reset transistor used as said resetting means, said reset transistor being connected with said diode and a source follower circuit for receiving the output signal at a point connecting said diode and said reset transistor, said diode receiving charges transferred through said charge transfer section.

6. The readout circuit of a charge transfer device having a charge transfer section, said readout circuit comprising a first diode receiving charges transferred through said charge transfer section, a first transistor having a source electrode connected to said diode, a gate electrode receiving a reset pulse and a drain electrode, a first source follower circuit having an input terminal connected to said source electrode of said first transistor and an output terminal, a second diode having the same electrical characteristics as said first diode, a second transistor having the same electrical characteristics as said first transistor and having a source electrode connected to said second diode and a gate and a drain electrode connected each other, a second source follower circuit having the same circuit configuration and the same electrical characteristics as said first source follower circuit and having an input terminal connected to said source electrode of said second transistor and an output terminal, a comparator having a first input connected to the output terminal of said second source follower circuit, a second input receiving a reference voltage and an output connected to said drain electrodes of said first and second transistors.

7. A readout circuit of a charge transfer device having a charge transfer section, said readout circuit comprising a diode receiving charges transferred through said charge transfer section, a reset transistor having a source electrode connected to said diode, a gate electrode receiving a reset pulse and a drain electrode, a source follower circuit having an input terminal connected to said source electrode of said reset transistor and an output terminal, a sample-hold circuit sampling the voltage at said output terminal of said source follower circuit to hold when said reset transistor turns on, and a comparator having a first input connected to said output terminal, a second input receiving a reference voltage and an output connected to said drain electrode of said reset transistor.

* * * * *